(12) United States Patent
Bethune et al.

(10) Patent No.: US 8,830,725 B2
(45) Date of Patent: Sep. 9, 2014

(54) LOW TEMPERATURE BEOL COMPATIBLE DIODE HAVING HIGH VOLTAGE MARGINS FOR USE IN LARGE ARRAYS OF ELECTRONIC COMPONENTS

(75) Inventors: Donald S Bethune, San Jose, CA (US); Kailash Gopalakrishnan, San Jose, CA (US); Andrew J Kellock, Sunnyvale, CA (US); Rohit S Shenoy, Fremont, CA (US); Kumar R Virwani, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 561 days.

(21) Appl. No.: 13/209,569

(22) Filed: Aug. 15, 2011

(65) Prior Publication Data

US 2013/0044532 A1    Feb. 21, 2013

(51) Int. Cl.
*G11C 11/00* (2006.01)
(52) U.S. Cl.
USPC ............... 365/148; 365/163; 257/2; 257/473; 257/485; 257/E27.009
(58) Field of Classification Search
CPC ........... G11C 13/0007; G11C 2213/71; G11C 2213/76; G11C 7/18; G11C 11/15; G11C 11/5685; G11C 13/0004; G11C 11/5678; H01L 45/06; H01L 45/1246; H01L 45/148
USPC .......... 365/148, 163, 174; 257/2–5, 471–473; 257/485, E27.009, E27.012, E27.016, 257/E29.068, E29.079; 438/261, 263, 264; 977/745, 746
See application file for complete search history.

(56) References Cited

U.S. PATENT DOCUMENTS

| | | | |
|---|---|---|---|
| 6,653,704 B1 | 11/2003 | Gurney et al. | |
| 6,855,975 B2 | 2/2005 | Gilton | |
| 7,368,822 B2 | 5/2008 | Lee et al. | |
| 7,719,082 B2 | 5/2010 | Aratani et al. | |
| 7,791,060 B2 | 9/2010 | Aochi et al. | |
| 8,374,018 B2* | 2/2013 | Lu ................. | 365/148 |
| 2005/0173771 A1 | 8/2005 | Sharma | |
| 2010/0001252 A1 | 1/2010 | Symanczyk et al. | |
| 2011/0001112 A1 | 1/2011 | Kiyotoshi | |
| 2012/0243292 A1* | 9/2012 | Takashima et al. ........... | 365/148 |

FOREIGN PATENT DOCUMENTS

CN    101704672 A    5/2010

OTHER PUBLICATIONS

Madeliene et al., "A study of copper coatings electrodeposited in electrolyte with a metallic powder of chromium," Journal of Surface & Coatings Technology, V200, N20-21, May 22, 2006, pp. 6123-6129, Switzerland.
Williams et al., "Pulsed laser deposition of chromium-doped zinc selenide thin films for mid-infrared applications," Journal of Applied Physics A-Materials Science and Processing, V91, N2, 2008, 13pgs, United States.

* cited by examiner

*Primary Examiner* — Hien Nguyen
(74) *Attorney, Agent, or Firm* — IP Authority, LLC; Ramraj Soundararajan

(57) ABSTRACT

A crystalline semiconductor Schottky barrier-like diode sandwiched between two conducting electrodes is in series with a memory element, a word line and a bit line, wherein the setup provides voltage margins greater than 1V and current densities greater than $5 \times 10^6$ A/cm$^2$. This Schottky barrier-like diode can be fabricated under conditions compatible with low-temperature BEOL semiconductor processing, can supply high currents at low voltages, exhibits high on-off ratios, and enables large memory arrays.

30 Claims, 20 Drawing Sheets

Current measurements showing >4MA/cm², high current density

Turn-on in <2μs,
Current = 240μA

560mV voltage margin

816 material

Turn-on in <2μs,
Current = 265μA

1140mV voltage margin

112 material

LOW TEMPERATURE BEOL COMPATIBLE DIODE HAVING HIGH VOLTAGE MARGINS FOR USE IN LARGE ARRAYS OF ELECTRONIC COMPONENTS

BACKGROUND OF THE INVENTION

1. Field of Invention

The present invention relates generally to the field of high current density access devices. More specifically, the present invention is related to a low temperature back end of line (BEOL) compatible diode having high voltage margins for use in large arrays of electronic components.

2. Discussion of Related Art

In order to increase the density of memory technologies (both volatile and nonvolatile), a crosspoint design is preferred. In such an optimized design, the wordlines and bitlines (hereafter referred to as memory lines) run at minimum pitch=2F, where F refers to the lithographic minimum feature size (for example, 32 nm), and storage elements are placed between these perpendicularly oriented memory lines at their crosspoints. Two possible designs exist in such memory technologies:

(a) A Nano-Crossbar Design: Refers to a design where the memory lines run at sublithographic pitches. In this design, memory cell area is reduced from $4F^2$ to $4F_S^2$ where $2F_S$ is the nanoscale pitch and $F_S \ll F$, where F is the above-mentioned lithographic minimum feature size. Previous studies detail how these sublithographic features are interfaced to lithographically defined wordline and bitline driver/decoder circuits.

(b) A 3D Design: Refers to a design where the memory lines run at lithographic pitches, with multiple layers of memories being provided. The effective area of these cells is therefore $4F^2/n$, where n is the number of stacked memory layers.

In either design case described above, two device components are needed at the intersection of the memory lines:

(a) A Memory Element: Refers to an element that is used to store data/information. Many options exist here (including, for example, phase change memory (PCM), MRAM, Resistive RAM, solid electrolyte memory, FeRAM, etc.), with one promising memory node material being PCM.

(b) A Rectifying Element or Access Device: Since a transistor is not provided at every crosspoint, a device is needed to rectify (exhibit nonlinearity). This ensures that the memory cells that lie on unselected wordlines and bitlines are not inadvertently programmed or shorted to each other and do not leak any significant amount of current.

For most promising memory materials, programming current densities that are of the order of $10^7$-$10^8$ A/cm$^2$ are needed for critical dimensions (CDs) in the range of 20-40 nm. FIG. 1 illustrates a graph of reset current and reset current density versus critical dimension for resistive memory elements that controllably change phase upon the passage of current. It can be seen from FIG. 1 that currents reduce with scaling but current densities increase substantially due to thermal losses that increase with scaling.

It should be noted that since the PCM CD is smaller than F (to minimize reset currents and to minimize proximity effects), the effective current density in the series diode is somewhat smaller. If the PCM CD ranges from 0.5F (¼th of the pitch) to 0.66F (⅓rd of the pitch), the reset currents in the diode would be 2.25× to 4× smaller. However, such current densities are still extremely high.

The best known single-crystal silicon p-n and Schottky diodes that can be used for rectification provide 1-2×10$^7$ A/cm$^2$ at low voltages. This limit comes from a number of different factors including high level injection effects in p-n junctions, and series resistance of doped region(s), etc. This is an order of magnitude smaller than what is needed for most resistive memory elements. In addition, the quality of the diodes that can be fabricated in middle-of-line (MOL) or back end of line (BEOL) lower temperature processes are typically much worse since they have to be made in amorphous or polycrystalline silicon that has much lower mobility. These considerations prevent the use of p-n junctions in either single-crystal silicon or other silicon materials as rectifiers for high-current memory elements (especially in 3D).

In addition, the current through unselected cells has to be small to prevent array-disturbs and reduce programming power. Typically, a rectification ratio well in excess of 10 times the number of elements on the Word Line (WL) or Bit Line (BL) is needed. In other words, for typical Mbit arrays, a rectification ratio of 10,000 or above is needed (preferably exceeding 10$^7$). The rectification ratio is a function of the bias since the leakage is a function of bias.

One solution developed by the current assignee involves the use of a solid electrolyte (SE) device element (see, for example, U.S. Pat. No. 7,382,647) as an access (diode) element for PCM. The advantage of this approach is the high ON/OFF ratio, as the SE can provide very high currents in the ON state (since it has a metallic filament that bridges the two electrodes) and very low OFF currents. However, disadvantages with this approach include:

(a) the need for an explicit erase step to erase the filament, wherein such an erase step can be quite slow (for example, 100's of microseconds are needed to erase a thick filament), and (b) the low reliability/endurance of the SE element during high current programming.

Another solution developed by the current assignee, as disclosed in the application entitled, "Backend of Line (BEOL) Compatible High Current Density Access Device for High Density Arrays of Electronic Components" (U.S. Ser. No. 12/727,746), involves the use of a diode as an access device. In this solution, the diode provides high ON/OFF ratio, low-temperature BEOL compatible fabrication capabilities, and the ability to provide high current densities. A limitation of the preferred diode material material described in that application, of a type we refer to as $M_8X_1Y_6$ or 816, is its low voltage margin of ~1.1V.

There is, therefore, a need for a diode (for use as an access element for semiconductor memory arrays) that can supply high current-densities and operate reliably while being fabricated at temperatures that are compatible with standard BEOL processing (i.e., below 400° C.).

In addition, there are other electronic applications involving dense arrays of components, such as liquid crystal displays (LCDs) and organic light-emitting diodes (OLEDs) arrays, which require an access element that would provide single (or multiple) element addressability while blocking multiple current paths through half-selected or unselected elements.

Embodiments of the present invention are an improvement over prior art systems and methods.

SUMMARY OF THE INVENTION

The present invention teaches the synthesis of a crystalline semiconducting material which addresses the voltage margin limitation of other diodes. In order to enable larger arrays (>1 MB) of memory elements to be addressed, a voltage margin of 1.5V will be required. The current invention provides a half-margin of about 1V (as measured with conductive atomic force microscopy (AFM)) that results in a total margin of 2V.

The present invention provides for a family of crystalline materials that is used as high-current density "access devices" in electronic applications involving dense arrays of components such as memories and displays, wherein the crystalline materials have the following chemical formula:

$$M_aX_bY_2,$$

where a=0.4 to 1.2, b=0.8 to 1.2,
where M is selected from the group consisting of Cu, Ag, Li and Zn,
where X is selected from the group consisting of Cr, Mo and W, and
where Y is selected from the group consisting of Se, S, O and Te.

Non-limiting examples of such crystalline materials include $Cu_{0.24}Cr_{0.26}S_{0.5}$ and $Cu_{0.24}Cr_{0.26}Se_{0.5}$. Although a few specific examples of the crystalline materials are provided in this specification, it should be noted that other combinations of various elements provided above could also be used without departing from the scope of the present invention.

Such crystalline materials can be fabricated at BEOL compatible temperatures (sub 400° C.). In addition, access-devices fabricated using these materials have been shown to carry high current densities and exhibit excellent ON/OFF ratios when sandwiched between appropriate electrodes.

In one embodiment, the present invention provides for a device, comprising: (a) bit line; (b) a $M_aX_bY_2$ layer, wherein a=0.4 to 1.2, b=0.8 to 1.2, M is selected from the group consisting of Cu, Ag, Li and Zn, X is selected from the group consisting of Cr, Mo and W, and Y is selected from the group consisting of Se, S, O and Te; (c) a memory element (e.g., phase change memory (PCM), resistive RAM (RRAM), magnetoresistive RAM (MRAM), etc.); (d) a word line, and wherein the $M_aX_bY_2$ layer and the memory element are: (i) sandwiched between the bit line and the word line, and (ii) in electrical series with the word and bit lines.

In another embodiment, the present invention provides for a device, comprising: (a) a bit line; (b) a $Cu_aCr_bS_c$ layer sandwiched by top and bottom conductive layers, wherein a=0.24±0.005, b=0.26±0.005, and c=0.50±0.01; (c) a memory element (e.g., phase change memory (PCM), resistive RAM (RRAM), magnetoresistive RAM (MRAM), etc.); (d) a word line, and wherein the $Cu_aCr_bS_c$ layer and the memory element are: (i) sandwiched between the bit line and the word line, and (ii) in electrical series with the word and bit lines.

In another embodiment, the present invention provides for a device, comprising: (a) a bit line; (b) a $Cu_aCr_bSe_c$ layer sandwiched by top and bottom conductive layers, wherein a=0.24±0.005, b=0.26±0.005, and c=0.50±0.01; (c) a memory element (e.g., phase change memory (PCM), resistive RAM (RRAM), magnetoresistive RAM (MRAM), etc.); (d) a word line, and wherein the $Cu_aCr_bSe_c$ layer and the memory element are: (i) sandwiched between the bit line and the word line, and (ii) in electrical series with the word and bit lines.

The advantages of this invention over previous inventions include, but are not limited to:
(a) reliability—access device characteristics (of access devices fabricated according to the teachings of the present invention) do not change appreciably upon high-current cycling unlike the solid electrolyte based access devices;
(b) high ON/OFF ratio—wherein the ON/OFF ratio depends on the choices of M, X and Y;
(c) high current densities—current densities exceed $5 \times 10^6$ A/cm$^2$—which is a distinct advantage over amorphous Si or polycrystalline silicon;
(d) high voltage margins as compared against the voltage margins of previously disclosed access devices. Conductive AFM measurements indicate half-margins greater than 1V.

DESCRIPTION OF THE PREFERRED EMBODIMENTS

Figure 1:
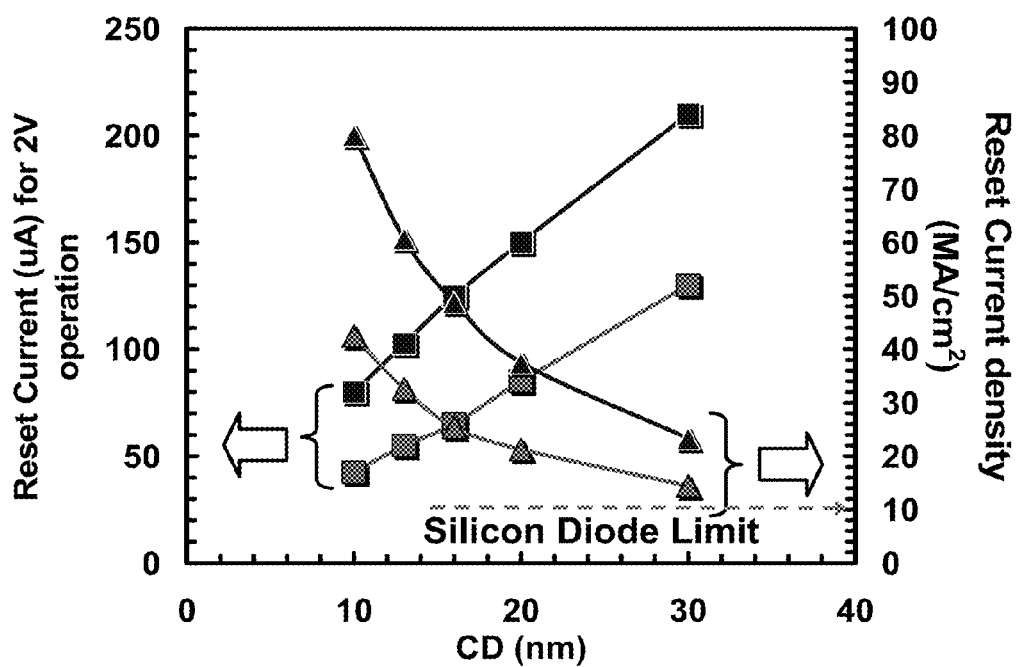
FIG. 1 illustrates a graph of reset current and reset current density versus critical dimension for resistive memory elements that controllably change phase upon the passage of current.

While this invention is illustrated and described in preferred embodiments, the invention may be produced in many different configurations. There is depicted in the drawings, and will herein be described in detail, preferred embodiments of the invention, with the understanding that the present disclosure is to be considered as an exemplification of the principles of the invention and the associated functional specifications for its construction and is not intended to limit the invention to the embodiments illustrated. Those skilled in the art will envision many other possible variations within the scope of the present invention.

The present invention provides for a family of crystalline materials that is used as high-current density "access devices" in electronic applications involving dense arrays of components such as memories and displays, wherein the crystalline materials have the following chemical formula:

$$M_aX_bY_2,$$

where a=0.4 to 1.2, b=0.8 to 1.2 (hereafter, abbreviated as 112),
where M is selected from the group consisting of Cu, Ag, Li and Zn,
where X is selected from the group consisting of Cr, Mo and W, and
where Y is selected from the group consisting of Se, S, O and Te.

Figure 2:
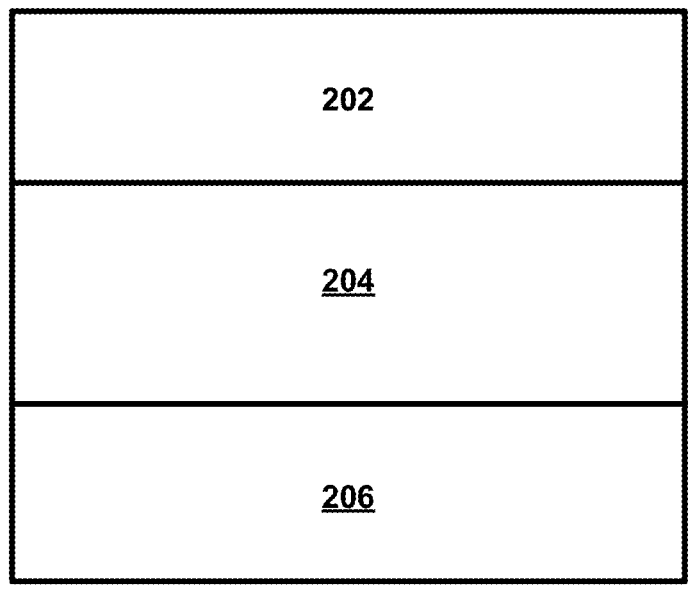
FIG. 2 depicts one embodiment of the present invention's for use as an access device, where a thin film of $M_aX_bY_2$ material is sandwiched between two conductive regions.

FIG. 2 depicts one embodiment of the present invention's device structure for use as an access device, where a thin film 204 of the above-mentioned $M_aX_bY_2$ material is sandwiched between two conductive regions 202 and 206, respectively. It should be noted that although the specification discusses, in various examples, a single layer of $M_aX_bY_2$ material, one of ordinary skill in the art will recognize that multiple layers of $M_aX_bY_2$ films with different compositions may be also be used instead of such a single layer.

In one embodiment, a thin-film (typically 20-100 nm) of the above-mentioned $M_aX_bY_2$ material is sandwiched between two conductive regions, wherein the conductive regions could be metals or different semiconductors. In one non-limiting example of this embodiment, a 40 nm film of $Cu_{0.24}Cr_{0.26}S_{0.5}$ is sandwiched between W and Pt electrodes, whereby this setup exhibited Schottky diode-like characteristics with the Pt electrode when the W electrode is swept negative with respect to the Pt electrode.

Figure 3:
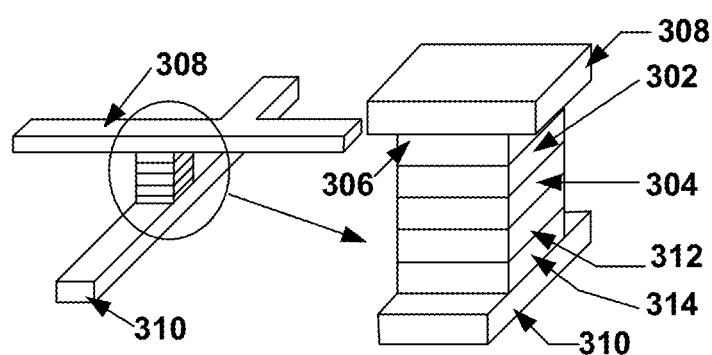
FIG. 3 depicts a preferred embodiment, where a thin-film comprising a $Cu_{0.24}Cr_{0.26}S_{0.5}$ layer is sandwiched between W electrodes or between W and a Cu (or $Cu_3Ge$) electrode.

FIG. 3 depicts a preferred embodiment, where a thin-film comprising a $Cu_{0.24}Cr_{0.26}S_{0.5}$ layer 302 is sandwiched between conducting regions 304 and 306. The conducting regions (304 and 306), the $Cu_{0.24}Cr_{0.26}S_{0.5}$ layer 302, the phase change/memory material 312, and conductive region 314 are in series electrical connection with a word line 308 and a bit line 310. It should be noted that although FIG. 3 depicts a single $Cu_{0.24}Cr_{0.26}S_{0.5}$ layer, one of ordinary skill in the art will recognize that the $Cu_{0.24}Cr_{0.26}S_{0.5}$ layer may be present with one or more interfacial layers. In a non-limiting example, each of the conducting regions 304 and 306 may be formed of W and W, W and Cu, or W and $Cu_3Ge$.

It should be noted that in the above-described example, although a specific example of $Cu_{0.24}Cr_{0.26}S_{0.5}$ layer 302 is used, it should be noted that slight variances are within the scope of this embodiment. For example, layer 302 could be of the following makeup: $Cu_{0.24\pm0.005}Cr_{0.26}S_{0.5\pm0.005}S_{0.5\pm0.01}$. Furthermore, other trace impurities could also be present as part of layer 302.

Voltage margin is defined as the range of voltage across the access device for which the current through it is always below 10 nA. For instance, if the current increases above 10 nA at $-|Vb|$ volts on the negative side and at $+|Va|$ volts on the positive side of a curve that plots access device current versus voltage applied to the top electrode (with the bottom electrode grounded), then the voltage margin would be equal to $|Va|+|Vb|$.

Figure 4A:
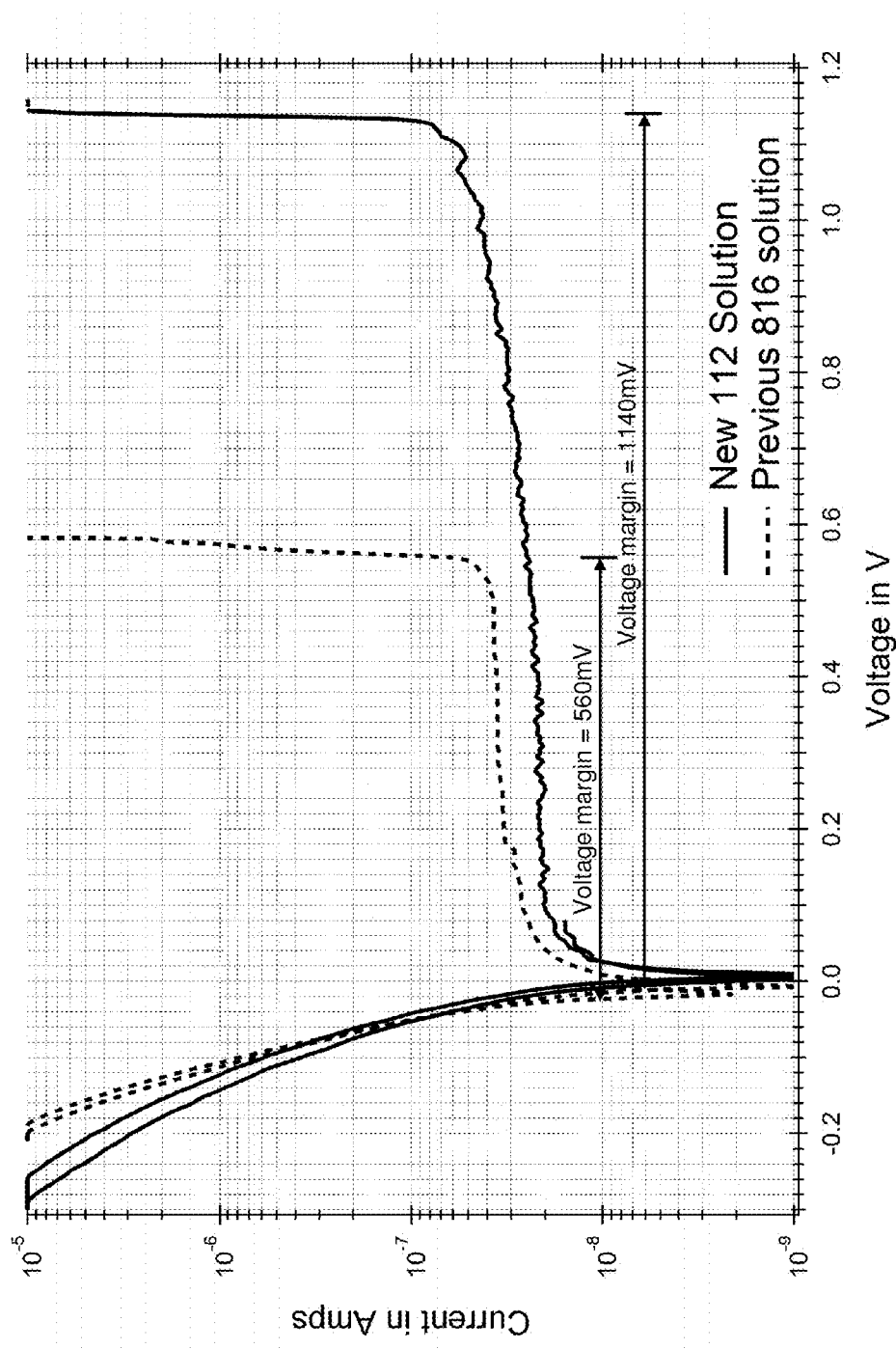
FIG. 4A depicts the I-V characteristics for a thin-film comprising a $Cu_{0.24}Cr_{0.26}S_{0.5}$ layer.

FIG. 4A depicts the current versus voltage (I-V) characteristics for a thin-film (approximately 30 nm) comprising a $Cu_{0.24}Cr_{0.26}S_{0.5}$ layer and W and Pt electrodes. As the voltage on the bottom W electrode in the device depicted in FIG. 4A is swept from 0 to a set of negative voltages, the device shows Schottky-barrier like behavior (i.e., the I-V characteristics show an exponential dependency of current on applied voltage). FIG. 4A also illustrates a comparison of the characteristics of the thin-film comprising a $Cu_{0.24}Cr_{0.26}S_{0.5}$ layer with the previous $M_8X_1Y_6$ solution disclosed in commonly assigned application entitled, "Backend of Line (BEOL) Compatible High Current Density Access Device for High Density Arrays of Electronic Components" (U.S. Ser. No. 12/727,746). For this comparison, the same experimental setup was used (including the same electrode materials and sizes), except that the sandwiched diode material was different (112 vs. 816). It should be noted that in FIG. 4A, the high leakage current observed on the positive voltage axis is an artifact of the measurement likely arising from oxidation and extreme asymmetry in electrode sizes (~1 cm bottom electrode vs. ~20 nm top electrode). Therefore, in the measurements of FIG. 4A, the right hand side of the voltage margin range is estimated from the point where the current shows an abrupt and substantial rise above the leakage floor. (Measurements made on 816 devices suggest that the AFM-measured voltage margin on blanket diode thin films is typically half of the voltage margin of devices made of the same diode material, when these devices are scaled down in size to form part of an integrated array.)

Figure 4B:
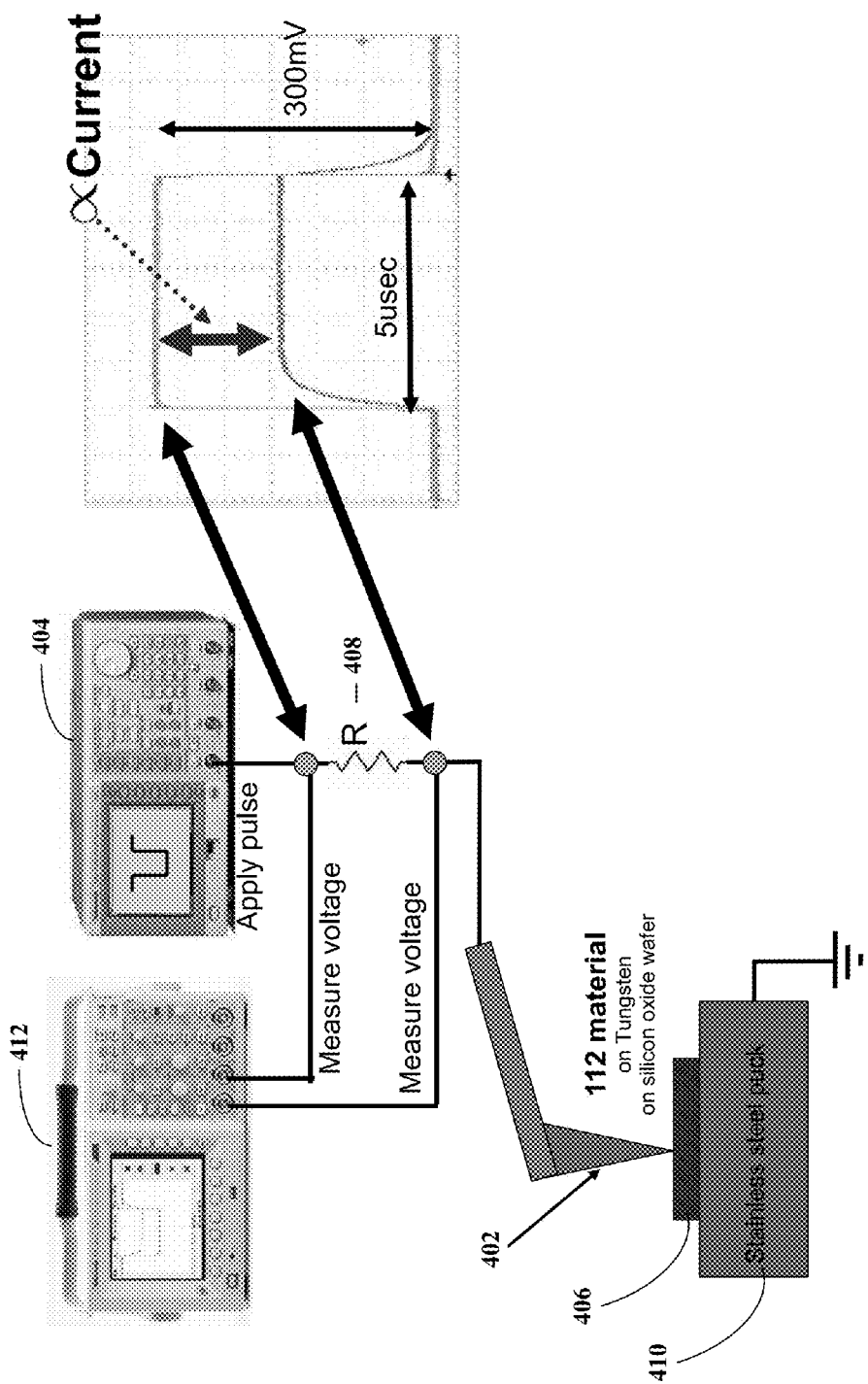
FIG. 4B illustrates an example of how high current density associated with the present invention's device comprising $M_aX_bY_2$ material is measured using conductive atomic force microscopy (C-AFM).

FIG. 4B illustrates an example of how high current density associated with the present invention's device comprising $M_aX_bY_2$ material 406 (which is grounded using a stainless steel puck 410) is measured using conductive atomic force microscopy (C-AFM). In this setup, a voltage pulse provided by voltage source 404 is applied to an AFM probe 402 and the current is measured, using current measuring device 412, based on the voltage drop across the series resistor 408.

Figure 4C:
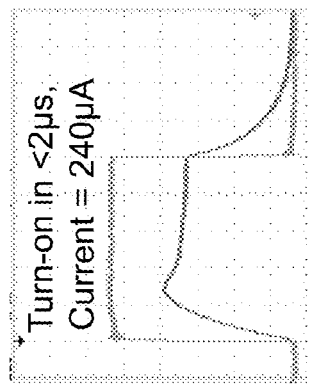
FIG. 4C depicts a comparison of current densities between the present invention's device comprising $M_aX_bY_2$ material and the $M_8X_1Y_6$ solution.
Figure 4C:
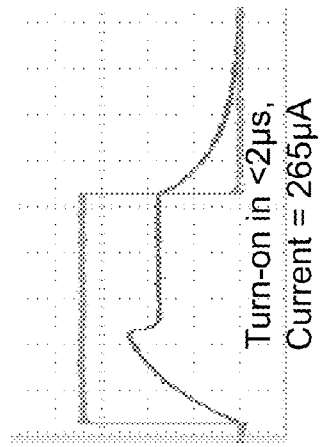

FIG. 4C depicts a comparison of current densities between the present invention's device comprising $M_aX_bY_2$ material and the $M_8X_1Y_6$ solution. A comparison with the previous $M_8X_1Y_6$ solution disclosed in commonly assigned application entitled, "Backend of Line (BEOL) Compatible High Current Density Access Device for High Density Arrays of Electronic Components" (U.S. Ser. No. 12/727,746), shows a voltage margin improvement from 560 mV (for $M_8X_1Y_6$) to 1140 mV (for devices based on the present invention's $Cu_{0.24}Cr_{0.26}S_{0.5}$ film). In addition, pulsed measurements on devices having the present invention's $Cu_{0.24}Cr_{0.26}S_{0.5}$ films show that very high current densities, of order $5\times10^6$ A/cm$^2$, or greater, are observed.

Possible Device Structures:

Although a few non-limiting examples of possible device structures are shown and discussed below, it should be noted that there are many possible device structures that could be fabricated using semiconductor fabrication tools/processes that could be made to exhibit the above device characteristics.

Figure 5:
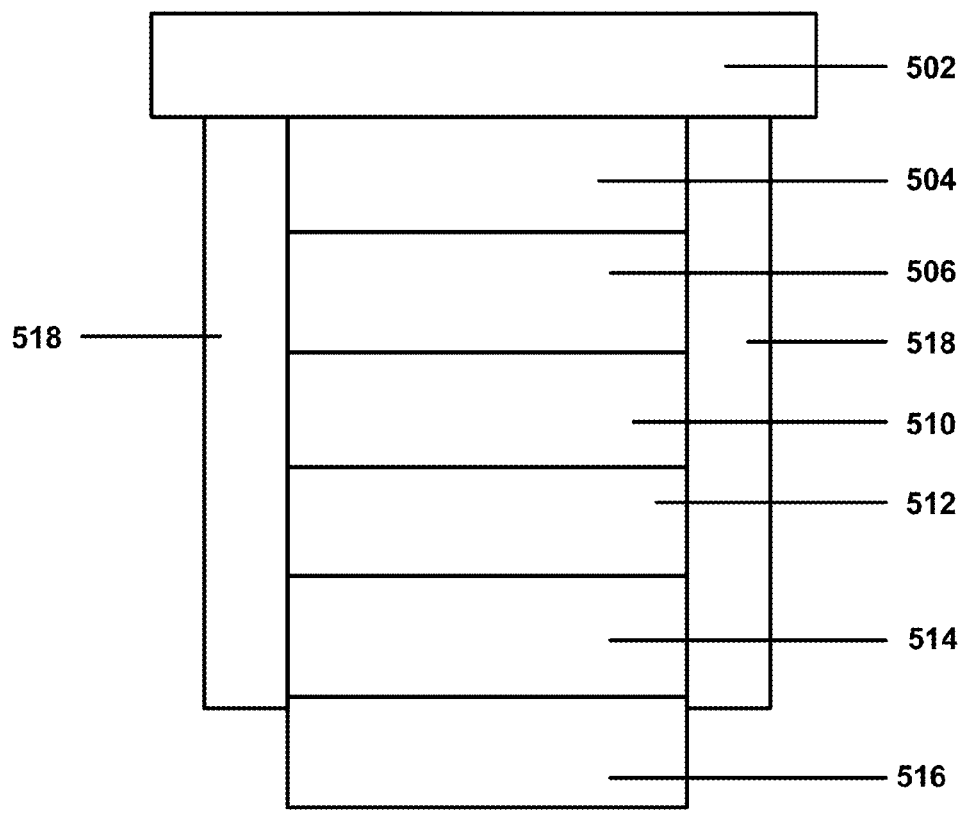
FIG. 5 depicts an example of a device stack structure wherein a $M_aX_bY_2$ layer is sandwiched between dielectrics on its side, and electrodes/semiconductors on the top and bottom.

FIG. 5 depicts a device structure for the access-device stack, wherein a $M_aX_bY_2$ layer 506 is sandwiched between dielectrics 518 and 518 on its side, and electrodes/semiconductors on the top and bottom in electrical series with word and bit lines 502 and 516. The device structure of FIG. 5 also depicts tungsten (W)/metal lines 504, 510, & 514, and phase change/memory material 512. One way of building such a structure is to fill the $M_aX_bY_2$ material into a pore or via. The dielectrics into which a via is etched could be made of silicon oxide, silicon nitride or some other low-K dielectric.

Provided below is a non-limiting example of how the stack shown in FIG. 5 may be manufactured. Dielectric 518 is deposited using, for example, physical or chemical vapor deposition, onto a wafer that has patterned lines of bit lines 516. Lithography is then performed on dielectric 518 to open up pores using a technique such as reactive plasma etching. $M_aX_bY_2$ layer 506 may be deposited using physical vapor deposition usually at elevated temperatures. Layers 504, 506, 510, 512, 514 can be deposited using a variety of different techniques including, but not limited to, Chemical Vapor deposition (CVD), Physical Vapor deposition techniques (PVD—for example sputtering, evaporation etc.), spin-on techniques, Atomic Layer deposition techniques (ALD), etc. Also, specific features of such layers can be defined using various lithography techniques, etching, chemical mechanical polishing, liftoff, etc. For fabricating each of these structures, various possible process flows are possible.

Figure 6:
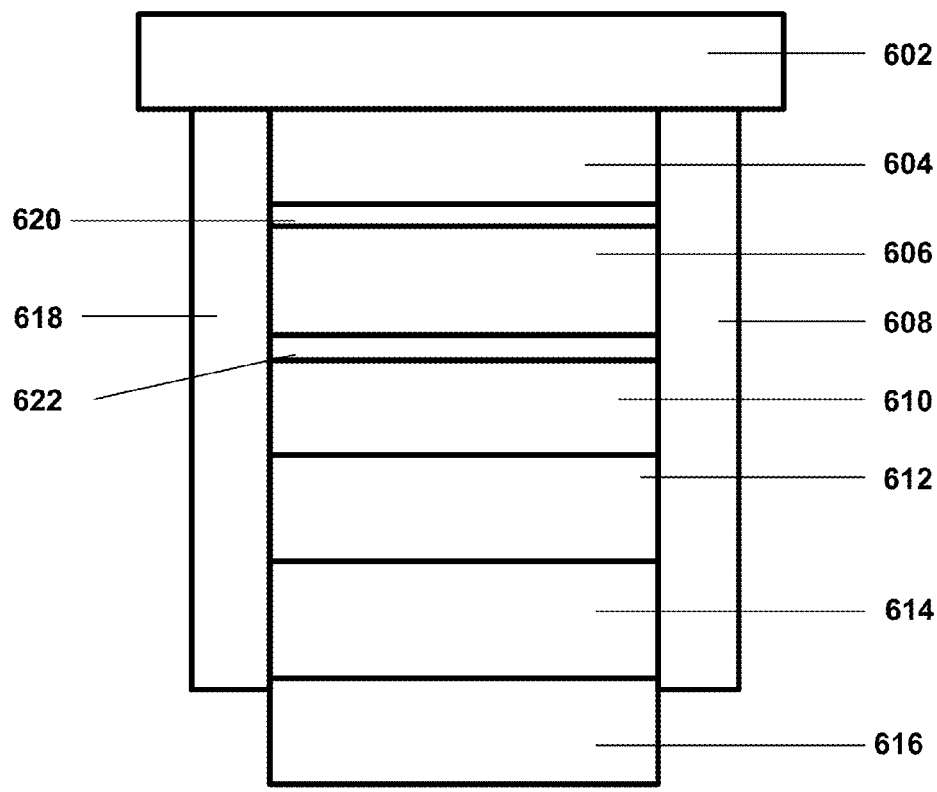
FIG. 6 depicts the stack structure of FIG. 5 along with two interfacial layers disposed between the $M_aX_bY_2$ layer and the tungsten (W)/metal lines.

FIG. 6 depicts another possible device stack structure, which is similar to the stack structure of FIG. 5. In this example, just as in FIG. 5, a $M_aX_bY_2$ layer 606 is sandwiched between dielectrics 608 and 618 on its side, and electrodes/semiconductors on the top and bottom in electrical series with word and bit lines 602 and 616. The device structure of FIG. 6, just as in FIG. 5, also depicts tungsten (W)/metal lines 604, 610, & 614, and phase change/memory material 612. However, unlike the stack structure of FIG. 5, the stack structure of FIG. 6 further comprises one or more additional interfacial layers 620 and 622 that are added between the $M_aX_bY_2$ layer 606 and the tungsten (W)/metal lines 604 and 610. One or more interfacial layers 620 and 622 may be used to improve/modify the diode characteristics, wherein an interfacial layer 620 may be added to the interface of tungsten (W)/metal lines 604 and $M_aX_bY_2$ layer 606, and/or an interfacial layer 622 may be added to the interface of tungsten (W)/metal lines 610 and $M_aX_bY_2$ layer 606. For example, the voltage margin can be improved, by as much as 10%, by use of such interfacial layers. One possible choice for the interfacial layer is $SiN_X$.

Figure 7:
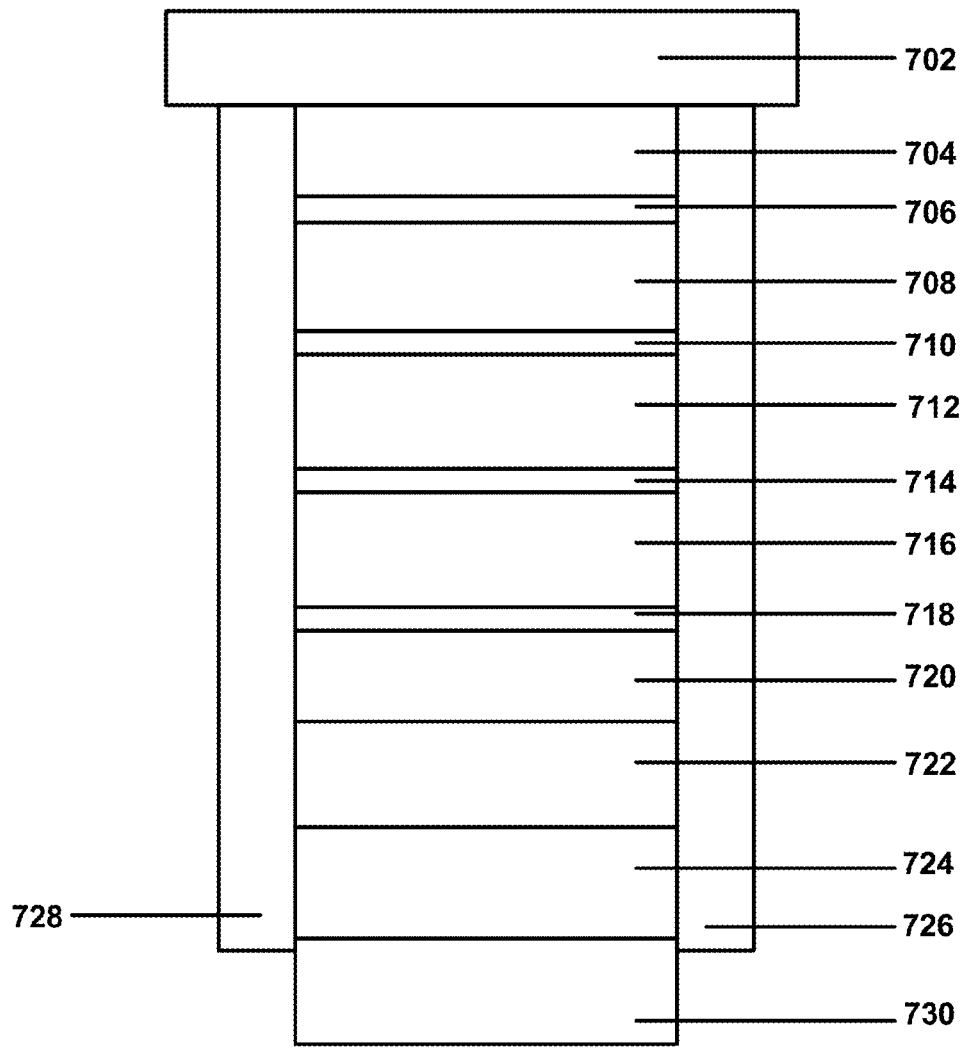
FIG. 7 depicts a hetero-structure formed of $M_aX_bY_2$ and $M_8XY_6$ layers along with additional interfacial layers.

FIG. 7 depicts a hetero-structure (combining characteristics of two diode materials) formed of a $M_aX_bY_2$ layer 708 and a $M_8XY_6$ layer 716 along with additional interfacial layers 706, 710, 714, and 718. The $M_aX_bY_2$ layer 708 and a $M_8XY_6$ layer 716 are sandwiched between dielectrics 726 and 728 on their side, and electrodes/semiconductors on the top and bottom in electrical series with word and bit lines 702 and 730. The device structure of FIG. 7 also depicts tungsten (W)/metal lines 704, 712, 720 & 724, and phase change/memory material 722.

The examples depicted in FIG. 5, FIG. 6 and FIG. 7 show embodiments where a thin film of $M_aX_bY_2$ is disposed between two electrodes and perpendicularly oriented word and bit lines. Thus, $M_aX_bY_2$ and its associated interfacial layers and electrodes connect to other elements, such as memory elements (e.g., phase change memory (PCM), resistive RAM (RRAM), magnetoresistive RAM (MRAM), etc.), resistors, LED stack or liquid crystal elements, in series.

A crosspoint memory array can be formed from an array of the devices shown in FIG. 3, FIG. 5, FIG. 6, and FIG. 7, wherein a voltage can be applied to the crosspoint array to change the state of one of the memory elements, which can be followed by a subsequent step of reading the state of the memory elements. For example, the state that is read out may be the resistance of the one of the memory elements.

Furthermore, as noted above, the stack structures shown in FIG. 5, FIG. 6, and FIG. 7 are mere representative examples, as there are many other device structures possible including mushroom-shaped cells, recessed mushroom cells, ring-shaped electrode and pillar cells. For each of these structures, many different process flows (integration schemes) are possible.

Furthermore, in some cases, where a thin film of $M_aX_bY_2$ is sandwiched between two electrodes, it is advantageous to scale the area of one of the contacts relative to the other to tune the electrical properties of this stack. For example, properties such as voltage margins, peak currents and sub-threshold slopes can be tuned using area symmetries.

Techniques to Produce $M_aX_bY_2$:

It should be noted that there are a plurality of ways to produce $M_aX_bY_2$, a few of which are listed below.

(a) Sputtering: This technique involves directly sputtering a thin film of $M_aX_bY_2$ using co-sputtering from one or more targets. Reactive gases (including those containing Y) may also be used during sputtering. Furthermore, it might be advantageous to deposit the $M_aX_bY_2$ at elevated temperatures (but still below 400° C.). One reason to deposit at elevated temperatures is to make the film crystalline. Furthermore, elevated temperature deposition aids in filling small pore structures and also mitigates detrimental effects of plasma on the thin film. Some sputtering examples include
  i. deposition from a $M_aX_bY_2$ target;
  ii. deposition from a $M_aX_bY_2$ target in the presence of $H_2Y$;
  iii. co-sputtering from a $M_aY$ and X targets; or
  iv. deposition from M and X in a $H_2Y$ or other reactive ambient.

(b) Chemical Vapor Deposition (CVD) or Atomic Layer Deposition (ALD) Process: CVD or ALD may be used to deposit $M_aX_bY_2$ on any desired substrate.

While a few examples to produce $M_aX_bY_2$ have been provided above, it should be noted that this list is by no means exhaustive, and that $M_aX_bY_2$ may be produced in other ways.

Specific Embodiments with PCM:

It should be noted that there are a number of possible structures that combine Phase Change Memory (PCM) and the present invention's $M_aX_bY_2$ layer. There are 4 PCM cell structures of interest—mushroom, recessed-mushroom, pore-cell (or memory-in-via) and ring-shaped electrode. Each structure could be fabricated using a number of different flows. Each device structure for the $M_aX_bY_2$ selection device could be combined with any of these four PCM cell structures in series with word and bit lines to yield a variety of possible structures/process-flows.

Figure 8A:
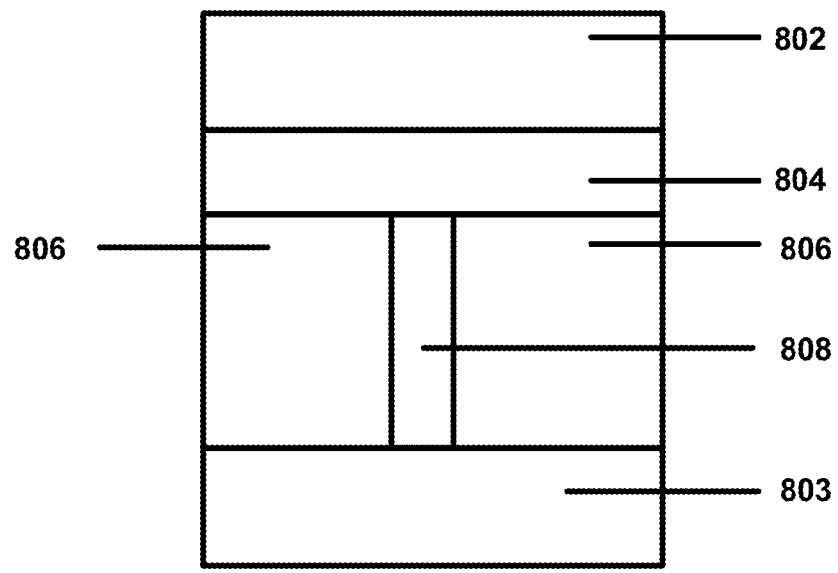
FIGS. 8a-f illustrate non-limiting examples of various structures of interest incorporating the present invention's high-current density access device, or diode device, having a $M_aX_bY_2$ layer.
Figure 8B:
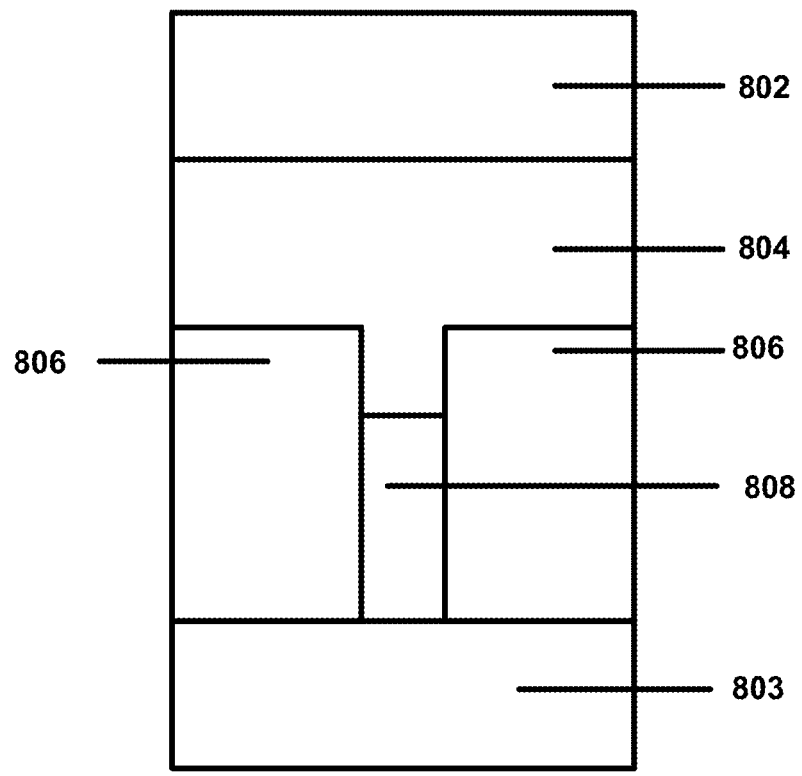
Figure 8C:
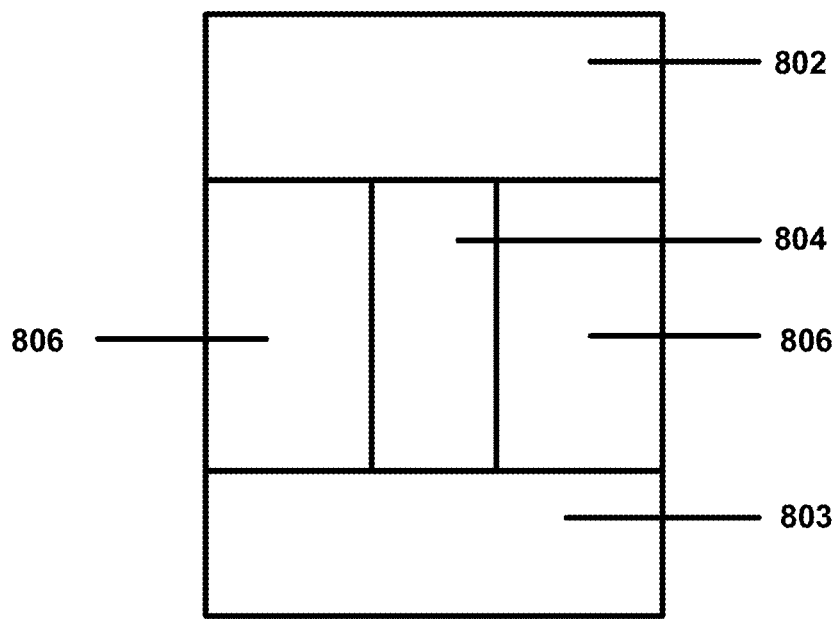
Figure 8D:
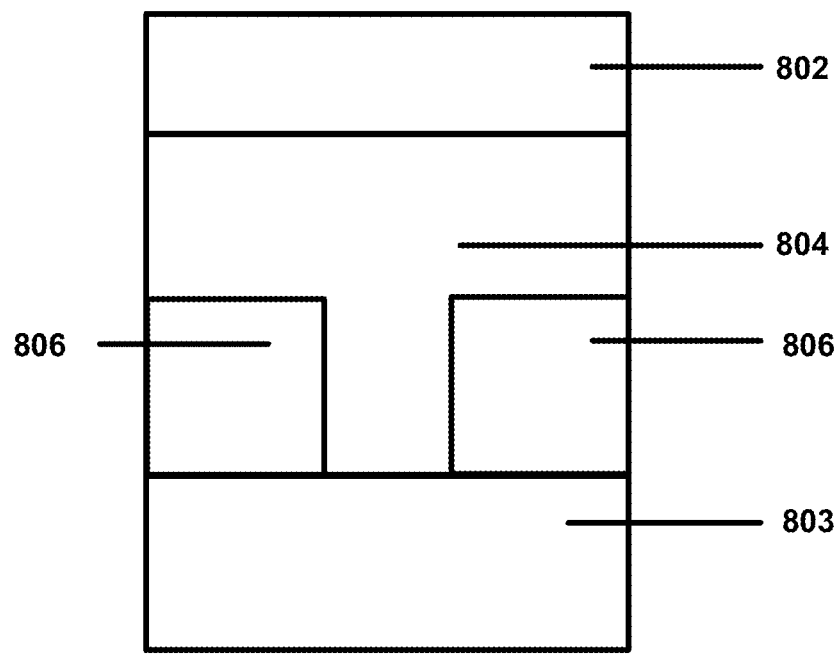
Figure 8E:
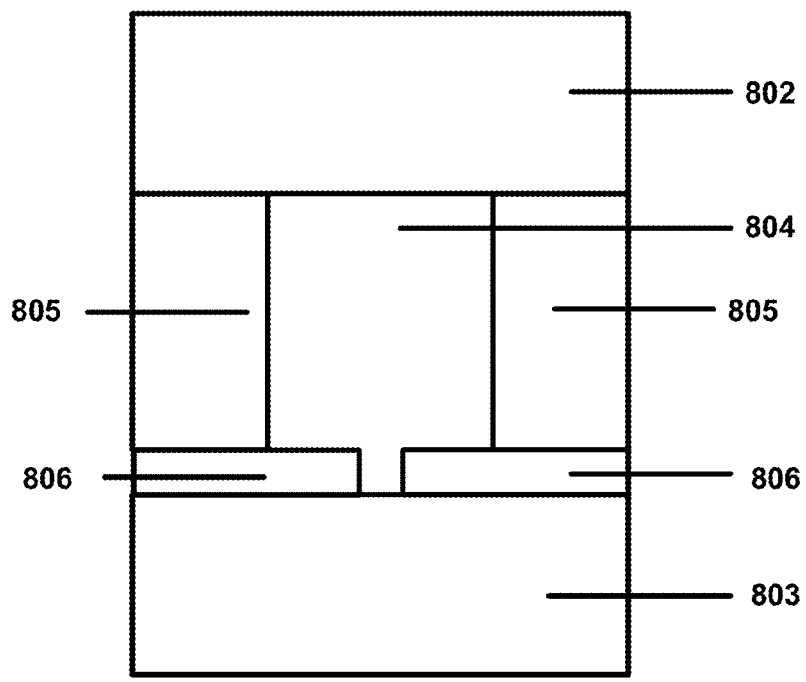
Figure 8F:
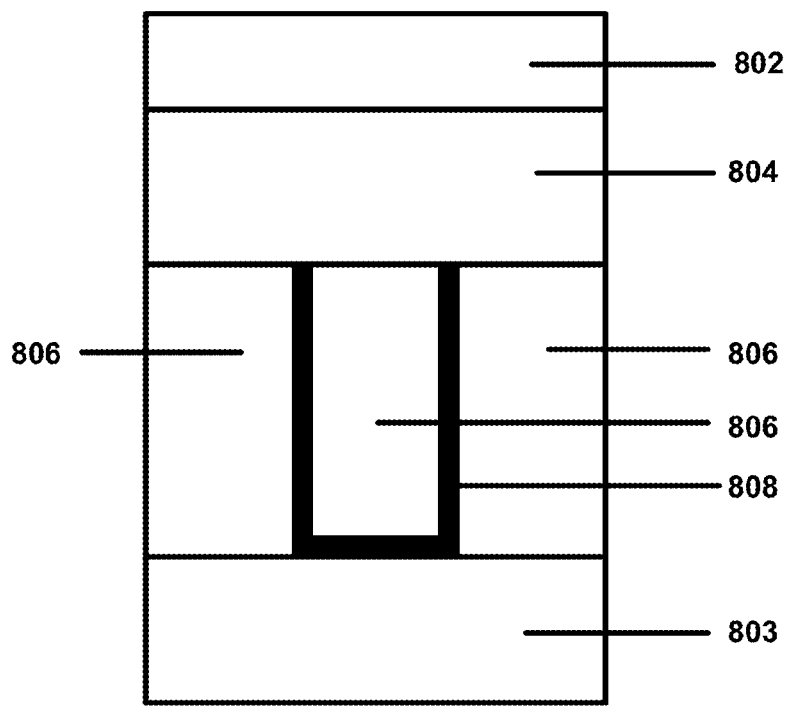

FIG. 8a illustrates a mushroom shaped structure incorporating the present invention's high-current density access device, or diode device, having a $M_aX_bY_2$ layer. FIG. 8b illustrates a recessed mushroom shaped structure incorporating the present invention's high-current density access device, or diode device, having a $M_aX_bY_2$ layer. FIG. 8c illustrates a pillar cell shaped or lithographically defined pore structure incorporating the present invention's high-current density access device, or diode device having a $M_aX_bY_2$ layer. FIG. 8d illustrates a lithographic pore structure incorporating the present invention's high-current density access device, or diode device, having a $M_aX_bY_2$ layer. FIG. 8e illustrates a sublithographic pore structure incorporating the present invention's high-current density access device, or diode device, having a $M_aX_bY_2$ layer. FIG. 8f illustrates a ring shaped structure incorporating the present invention's high-current density access device, or diode device, having a $M_aX_bY_2$ layer. In FIG. 8a through FIG. 8f, top layer 802 and bottom layer 803 are metal layers formed of, for example, TiN or W or Cu with optional barrier layers if necessary. Layer 804 is the present invention's high-current density access device having a $M_aX_bY_2$ layer, layer 806 is a layer formed of, for example, oxide/nitride/dielectric/silicon or some combination of these layers, and layer 808 is a metal layer formed of, for example, TiN or W. Layer 805 is another layer of dielectric material and could be oxide/nitride/oxynitride, etc.

Further, for the mushroom (FIG. 8a), recessed mushroom (FIG. 8b) and the ring-shaped cell (FIG. 8f), while the bottom electrode 803 (made, for example, from TiN or W or Cu) is typically a small-area contact, the memory material could be a line-type or a "via-fill" type material (i.e., patterned in one dimension versus two dimensions). Similarly, for the lithographic pore embodiment shown in FIG. 8d and the sublithographic pore embodiment shown in FIG. 8e, two options are possible where the bottom small-area via is 2D, but the top-pore could be either line type or via-fill type. The pillar embodiment shown in FIG. 8c is confined in both directions (i.e. 2D). Optional barrier layers, adhesion layers, passivation layers and capping layers have not been shown for convenience.

It should be noted that for all of the above-mentioned structures show in FIG. 8a through FIG. 8f, at least one electrode has to be inert (W/TiN/Al) and the other may be oxidizable (Ag/Cu). If both of the electrodes have to be made with Cu, then at least one of them has to have an inert liner.

It should also be noted that the options illustrated in FIG. 8a through FIG. 8f may be combined together to fabricate various device structures. Each combination could be fabricated using any one out of many process flows.

Figure 9A:
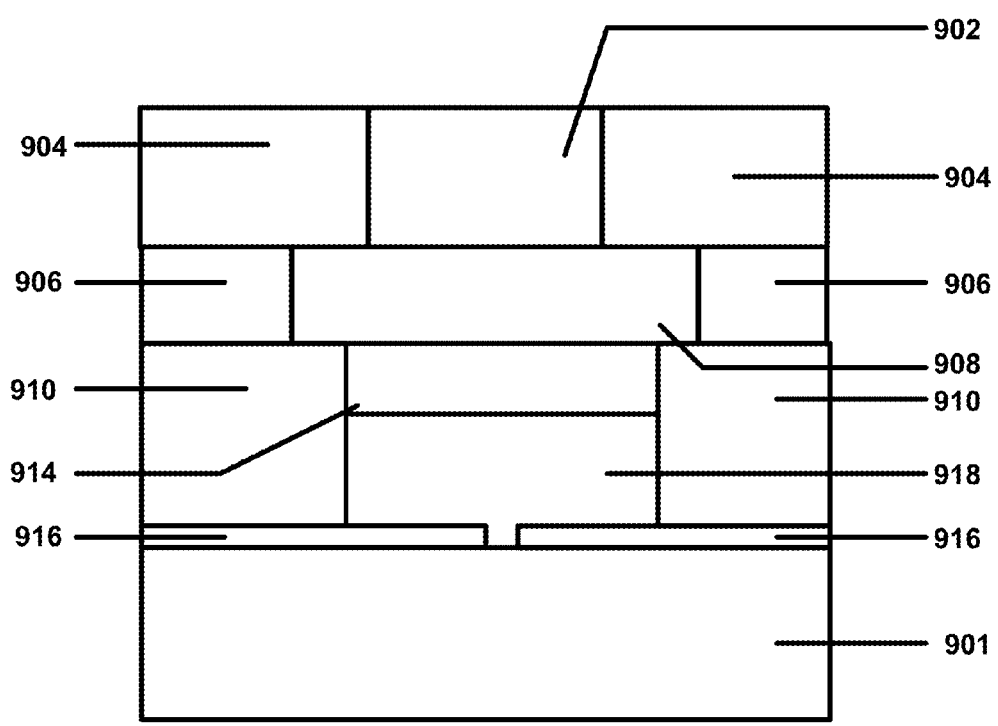
FIG. 9a illustrates a cross-section of a combination of a sublithographic pore device with a patterned diode having a $M_aX_bY_2$ layer.

For example, FIG. 9a illustrates a combination of a sublithographic pore structure with the present invention's diode device. The structure of FIG. 9a comprises the following layers: lower metal layer 901, formed of, for example, TiN or W or Cu (with barrier layers), a first set of dielectric layers 916, memory layer 918 (which could comprise a set of memory materials of varying composition), a second set of dielectric layers 910, another metal layer 914 formed of, for example, TiN or W, the present invention's high-current density access device, or diode device, having a $M_aX_bY_2$ layer 908, a third set of dielectric layers 906, an upper metal layer 902 formed of, for example, TiN or W, and a fourth set of dielectric layers 904. The memory layer 918 and layer 908 may be patterned in one dimension or two dimensions.

Figure 9B:
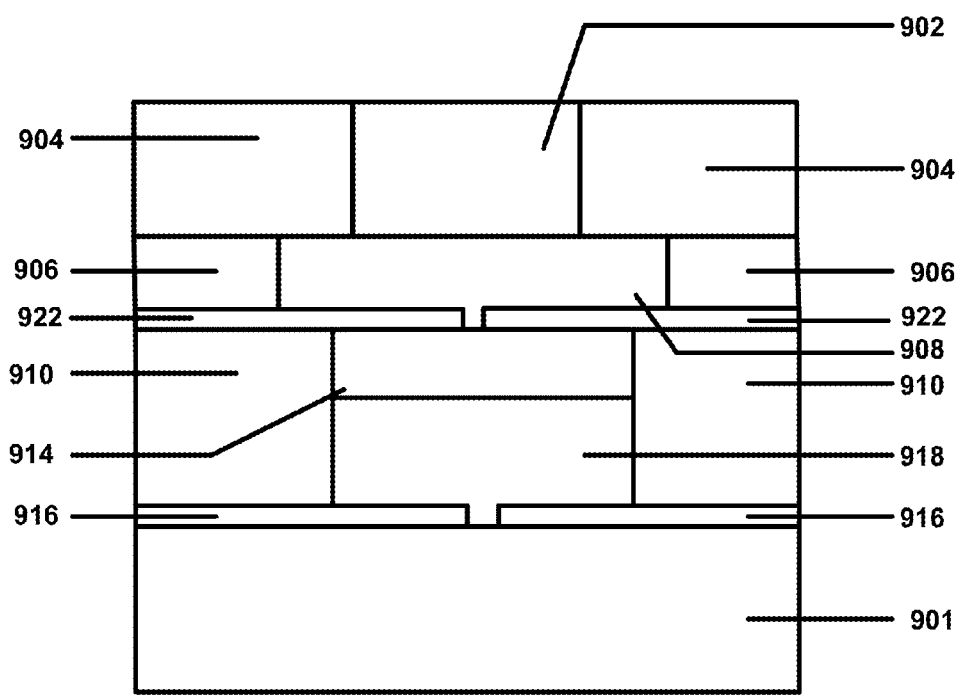
FIG. 9b illustrates another combination of a sublithographic pore device with the present invention's diode device.

As another example, FIG. 9b illustrates another combination of a sublithographic pore device with the present invention's diode device. The structure of FIG. 9b is similar to FIG. 9a, except that layer 908 is the present invention's high-current density access device, or diode device, having a $M_aX_bY_2$ layer and, in addition to being flanked by the third set of dielectric layers 906, layer 908 is flanked by a fifth set of dielectric layers 922.

The phrases "diode facing down" and "diode facing up" used in reference to FIG. 10-16 refer to the orientation of the diode with respect to the substrate. "Diode facing down" refers to the diode facing towards the silicon substrate (or the normal current flow direction is towards the substrate) and "diode facing up" refers to the diode facing away from the substrate (or the normal current flow direction is away from the substrate).

Figure 10:
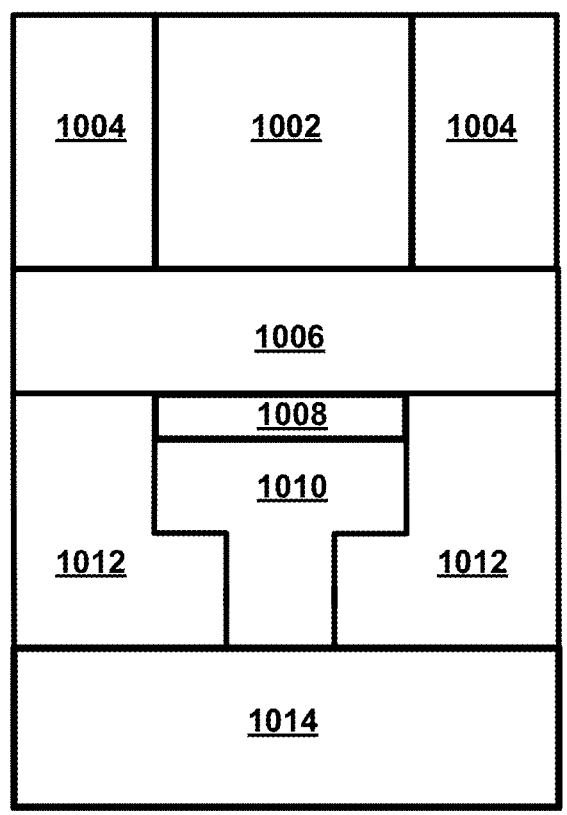
FIG. 10 illustrates a cross-section of a combination of a sublithographic pore memory structure with an unpatterned diode wherein the unpatterned diode faces the silicon substrate which has CMOS circuits.

As another example, FIG. 10 illustrates a combination of a sublithograhpic pore structure with an unpatterned diode having a $M_aX_bY_2$ layer, wherein the unpatterned diode having a $M_aX_bY_2$ layer faces the silicon substrate having CMOS circuits. The structure of FIG. 10 comprises the following layers: TiN/W or Ag/Cu top electrode (with barrier layers) 1002, a first set of dielectric layers 1004, unpatterned diode having a $M_aX_bY_2$ layer (or combination of diode having a $M_aX_bY_2$ layer and/or buffer layers, etc.) 1006, top electrode 1008, memory material 1010, a second set of dielectric layers 1012, and bottom electrode (made from, for example, a single metal or a combination of metals) 1014.

Figure 11:
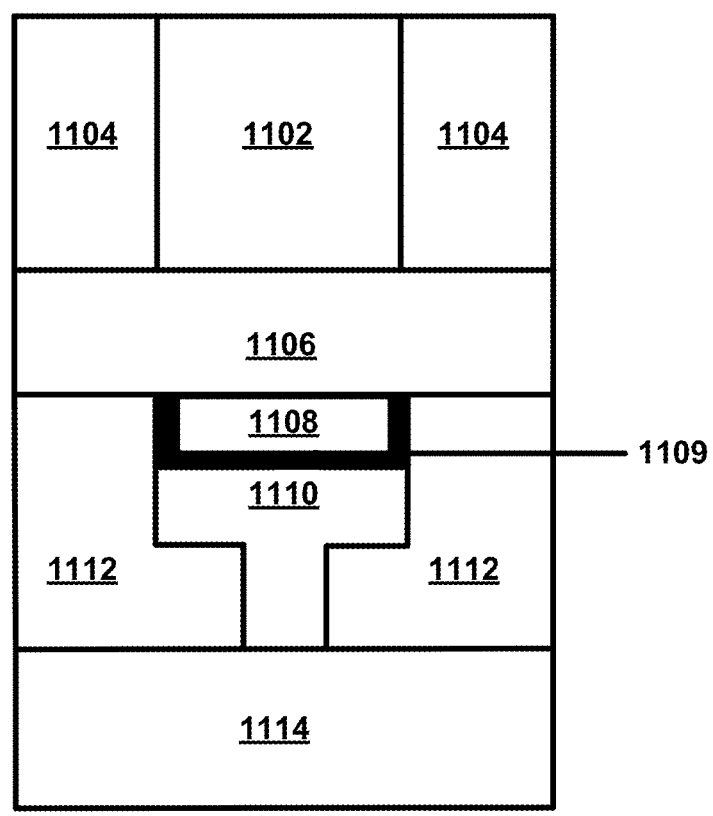
FIG. 11 illustrates a combination of a sublithographic pore structure with an unpatterned diode having a $M_aX_bY_2$ layer, wherein the unpatterned diode having a $M_aX_bY_2$ layer faces away from the silicon substrate having CMOS circuits.

As yet another example, FIG. 11 illustrates a combination of a sublithographic pore structure with an unpatterned diode having a $M_aX_bY_2$ layer, wherein the unpatterned diode having a $M_aX_bY_2$ layer faces away from the silicon substrate having CMOS circuits. The structure of FIG. 11 comprises the following layers: inert top electrode 1102 (which can be a combination of inert materials), a first set of dielectric layers 1104, unpatterned diode having a $M_aX_bY_2$ layer 1106, TiN/W or Ag/Cu top electrode (with barrier layers) 1108 that has an inert liner 1109, memory material 1110, a second set of dielectric layers 1112, and bottom electrode (made from, for example, a single metal or a combination of metals) 1114.

Figure 12:
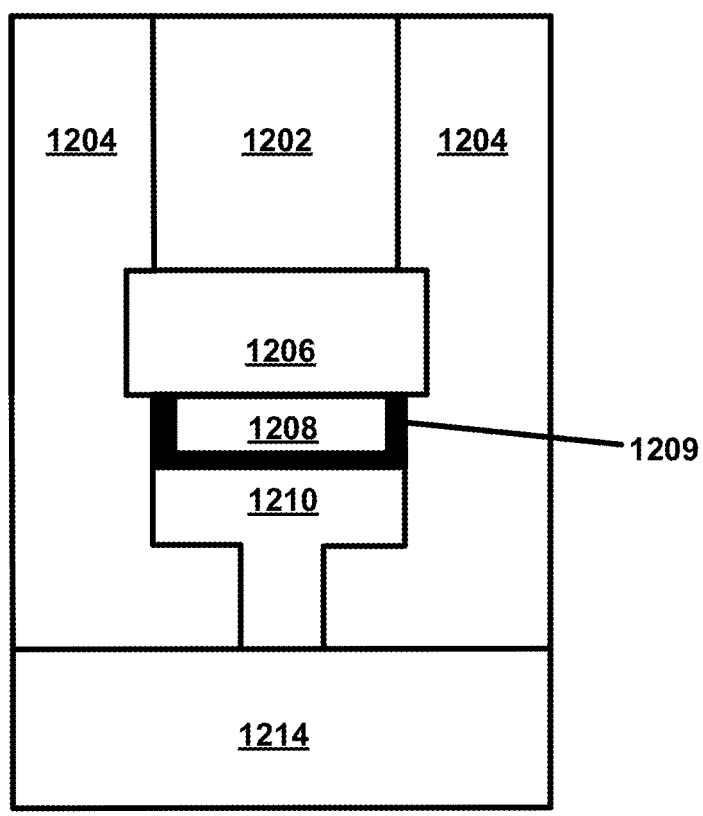
FIG. 12 illustrates a combination of a sublithographic pore structure with a patterned diode having a $M_aX_bY_2$ layer, wherein the patterned diode having a $M_aX_bY_2$ layer faces away from the silicon substrate having CMOS circuits.

As yet another example, FIG. 12 illustrates a combination of a sublithographic pore structure with a patterned diode having a $M_aX_bY_2$ layer, wherein the patterned diode having a $M_aX_bY_2$ layer faces away from the silicon substrate having CMOS circuits. The structure of FIG. 12 comprises the following layers: inert top electrode 1202 (which can be a combination of inert materials), a set of dielectric layers 1204, patterned diode having a $M_aX_bY_2$ layer 1206, TiN/W or Ag/Cu top electrode (with barrier layers) 1208 that has an inert liner 1209, memory material 1210, and bottom electrode (made from, for example, a single metal or a combination of metals) 1214.

Figure 13:
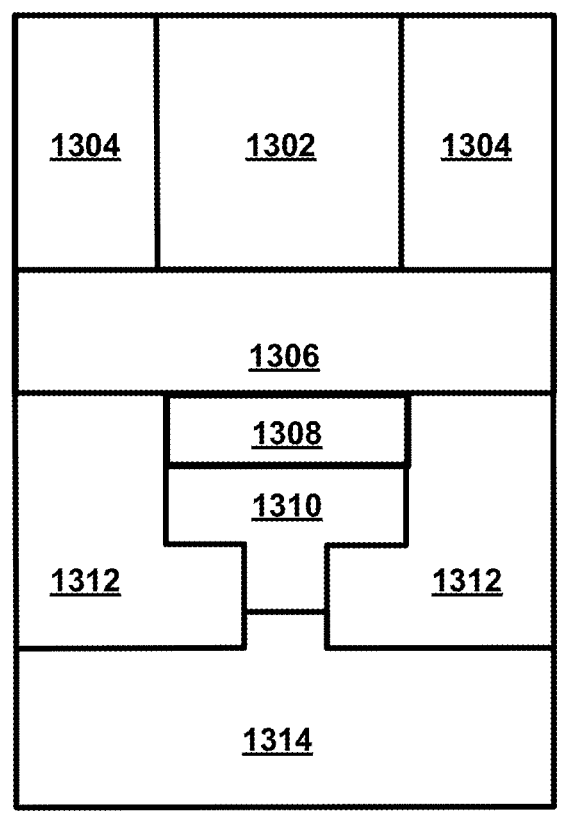
FIG. 13 illustrates a combination of a recessed mushroom structure with an unpatterned diode having a $M_aX_bY_2$ layer, wherein the unpatterned diode having a $M_aX_bY_2$ layer faces the silicon substrate having CMOS circuits.

As yet another example, FIG. 13 illustrates a combination of a recessed mushroom structure with an unpatterned diode having a $M_aX_bY_2$ layer, wherein the unpatterned diode having a $M_aX_bY_2$ layer faces the silicon substrate having CMOS circuits. The structure of FIG. 13 comprises the following layers: TiN/W or Ag/Cu top electrode (with barrier layers) 1302 (which can be a combination of different materials with optional barrier layers), a first set of dielectric layers 1304, unpatterned diode having a $M_aX_bY_2$ layer 1306, inert electrode 1308, recessed mushroom memory material 1310, a second set of dielectric layers 1312 and bottom electrode (made from, for example, a single metal or a combination of metals) 1314.

Figure 14:
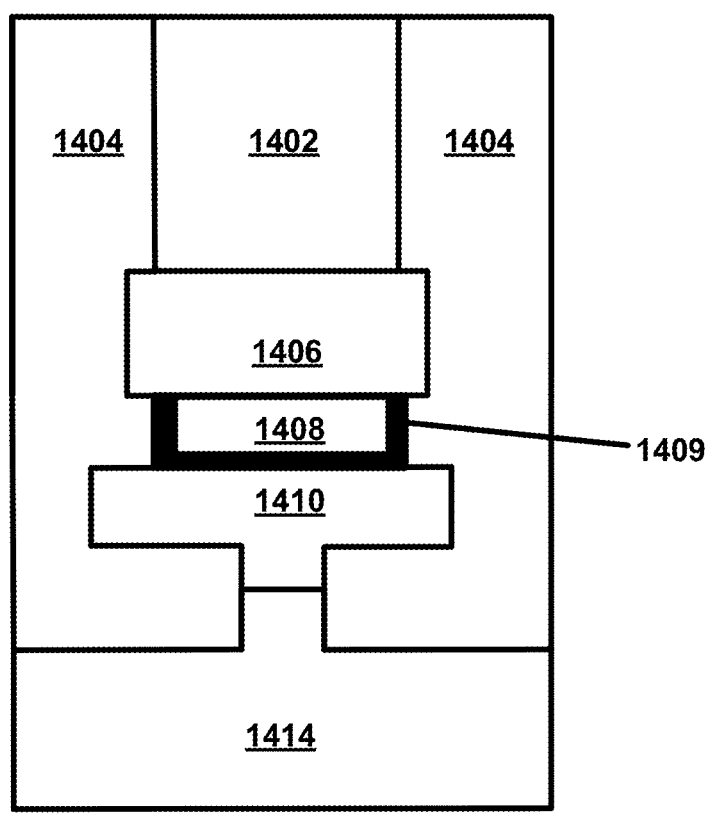
FIG. 14 illustrates a combination of a recessed mushroom structure with a patterned diode having a $M_aX_bY_2$ layer, wherein the patterned diode having a $M_aX_bY_2$ layer faces away from the silicon substrate having CMOS circuits.

As yet another example, FIG. 14 illustrates a combination of a recessed mushroom structure with a patterned diode having a $M_aX_bY_2$ layer, wherein the patterned diode having a $M_aX_bY_2$ layer faces away from the silicon substrate having CMOS circuits. The structure of FIG. 14 comprises the following layers: inert top electrode 1402 (which can be a combination of inert materials), a set of dielectric layers 1404, patterned diode having a $M_aX_bY_2$ layer 1406, TiN/W or Ag/Cu metal electrode (with barrier layers) 1408 with inert layer 1409, recessed mushroom memory material 1410, and bottom electrode (made from, for example, a single metal or a combination of metals) 1414.

Figure 15:
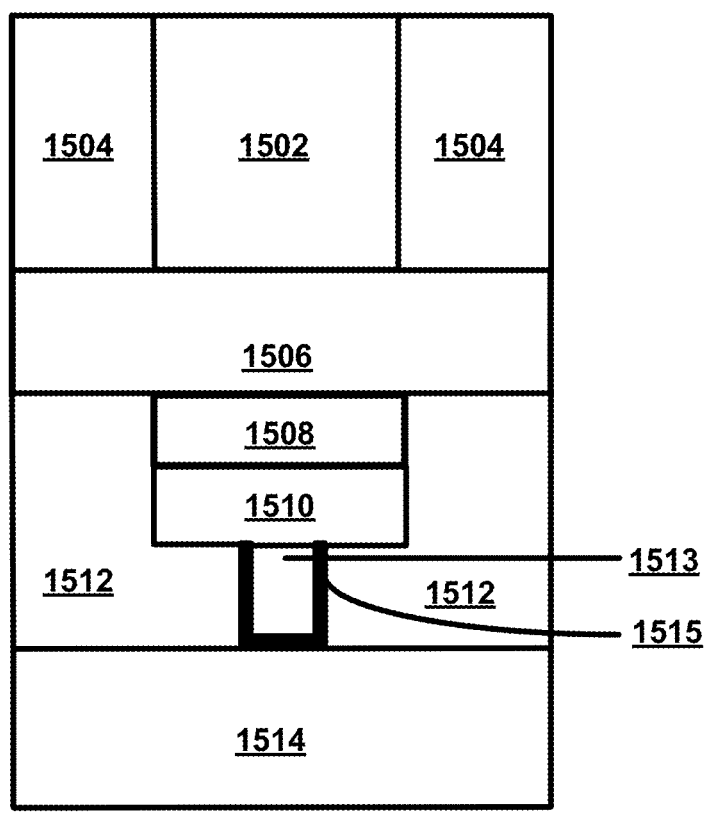
FIG. 15 illustrates a combination of a ring-shaped memory structure with an unpatterned diode having a $M_aX_bY_2$ layer, wherein the unpatterned diode faces the silicon substrate having CMOS circuits

As yet another example, FIG. 15 illustrates a combination of a ring-shaped memory structure with an unpatterned diode having a $M_aX_bY_2$ layer, wherein the unpatterned diode faces the silicon substrate having CMOS circuits. The structure of FIG. 15 comprises the following layers: TiN/W or Ag/Cu metal electrode 1502 (with barrier layers), a first set of dielectric layers 1504, unpatterned diode having a $M_aX_bY_2$ layer 1506, top electrode 1508, mushroom memory material 1510, a second set of dielectric layers 1512, a third dielectric region 1513, inert liner 1515, and bottom electrode (made from, for example, a single metal or a combination of metals) 1514.

Figure 16:
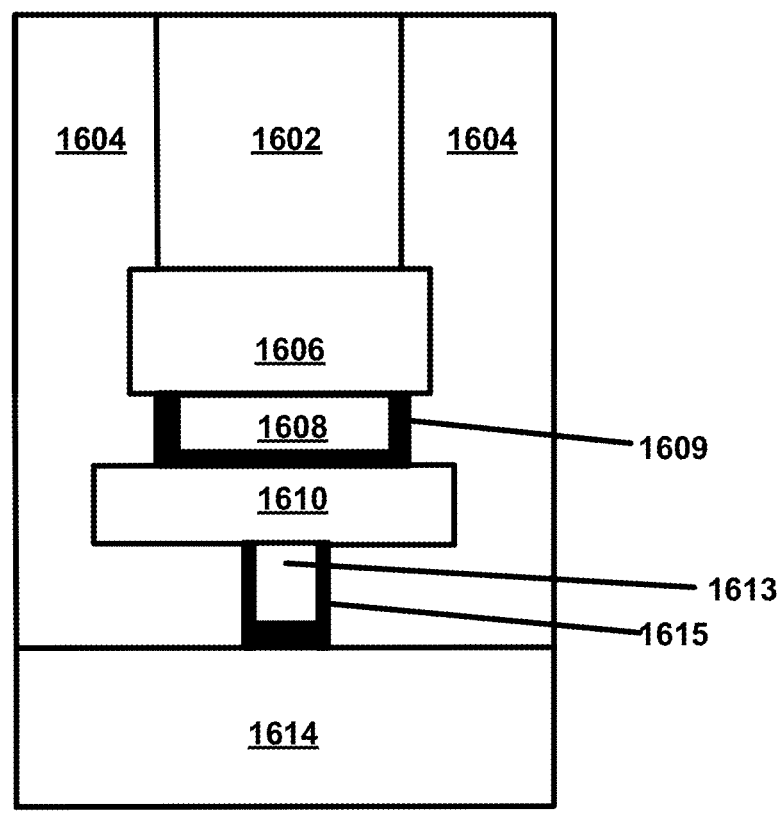
FIG. 16 illustrates a combination of a ring-shaped structure with a patterned diode having a $M_aX_bY_2$ layer, wherein the patterned diode faces away from the silicon substrate having CMOS circuits.

As yet another example, FIG. 16 illustrates a combination of a ring-shaped structure with a patterned diode having a $M_aX_bY_2$ layer, wherein the patterned diode faces away from the silicon substrate having CMOS circuits. The structure of FIG. 16 comprises the following layers: inert top electrode 1602 (which can be a combination of inert material), a set of dielectric layers 1604, patterned diode having a $M_aX_bY_2$ layer 1606, TiN/W or Ag/Cu metal electrode 1608 with inert layer 1609, memory material 1610, dielectric 1613, inert liner 1615, and bottom electrode (made from, for example, a single metal or a combination of metals) 1614.

It should be noted that FIGS. 8-16 are exemplary only and the layers in these figures could comprise multiple layers each. For example, the regions that indicate metal could comprise a series of metal/conductive layers with optional barrier layers and optional adhesion layers. Similarly the memory layers could comprise a series of layers with varying resistivity and/or concentration and may include optional dielectric layers, buffer layers and adhesion layers. The dielectrics themselves could consist of a series of dielectric layers. In the case of resistive memory elements which snap back from a high resistance state to the low resistance state (where snap back refers to the reduction in voltage as the memory element transitions from the high R state to the low R state), an additional series resistance could be employed and made in a conductive layer/dielectric layer or the memory layer itself (not shown for simplicity). In addition, it might be desirable to separate the solid electrolyte material and the memory material by metals or semiconductors if thermal isolation is important. Also, the preferred thickness of the various layers shown in each of these structures of FIGS. 8-16 may range from 1 nm to 5000 nm, preferably between 1 nm to 1 μm.

It should be noted that the above device structures of FIGS. 8-16 can be fabricated using conventional semiconductor processing techniques. For example, the various layers of the structures shown in FIGS. 8-16 can be deposited using a variety of different techniques including, but not limited to, Chemical Vapor deposition (CVD), Physical Vapor deposition techniques (PVD—for example sputtering, evaporation etc), spin-on techniques, Atomic Layer deposition techniques (ALD), etc. Also, specific features of FIGS. 8-16 can be defined using various lithography techniques, etching, chemical mechanical polishing, liftoff, etc. For fabricating each of these structures, various possible process flows are possible.

CONCLUSION

Devices and methods have been shown in the above embodiments for the effective implementation of a low temperature back end of line (BEOL) compatible diode having high voltage margins for use in large arrays of electronic components. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A device, comprising:
(a) a bit line;
(b) a $M_aX_bY_2$ layer, wherein
a=0.4 to 1.2, b=0.8 to 1.2,
M is selected from the group consisting of Cu, Ag, Li and Zn,
X is selected from the group consisting of Cr, Mo and W, and
Y is selected from the group consisting of Se, S, O and Te;
(c) a memory element;
(d) a word line, and
wherein the $M_aX_bY_2$ layer and the memory element are: (i) sandwiched between the bit line and the word line, and (ii) in electrical series with the word and bit lines.

2. The device of claim 1, wherein the $M_aX_bY_2$ layer is $Cu_aCr_bS_2$, where a=0.4 to 1.2 and b=0.8 to 1.2.

3. The device of claim 2, wherein the $M_aX_bY_2$ layer is $Cu_{0.24\pm0.005}Cr_{0.26\pm0.005}S_{0.5\pm0.01}$.

4. The device of claim 2, wherein the $M_aX_bY_2$ layer is $Cu_{0.24\pm0.005}Cr_{0.26\pm0.005}Se_{0.5\pm0.01}$.

5. The device of claim 1, further including conducting layers contacting opposite sides of the $M_aX_bY_2$ material.

6. The device of claim 5, wherein at least one of the conducting layers is inert.

7. The device of claim 5, wherein at least one of the conducting layers includes $Cu_3Ge$.

8. The device of claim 1, wherein the device operates reliably at a current density greater than $5\times10^6$ A/cm$^2$.

9. The device of claim 1, wherein the device has a voltage margin greater than 1V.

10. A crosspoint memory array comprising an array of the devices of claim 1.

11. A method, comprising applying voltage to the array of claim 10, thereby changing the state of one of the memory elements.

12. The method of claim 11, further comprising reading out the state of said one of the memory elements.

13. The method of claim 12, wherein the state that is read out is the resistance of one of the memory elements.

14. The device of claim 1, wherein the device is further sandwiched between dielectrics on its side.

15. The device of claim 1, wherein the device is part of any of, or a combination of, the following structures: a mushroom structure, a recessed mushroom structure, a pillar cell, a lithographic pore structure, a sublithographic pore structure, and a ring-shaped cell structure.

16. The device of claim 1, wherein said memory element is any of the following: phase change memory (PCM), resistive RAM (RRAM), or magnetoresistive RAM (MRAM).

17. A device, comprising:
(a) a bit line;
(b) a $Cu_aCr_bS_c$ layer sandwiched by top and bottom conductive layers, wherein
a=0.24±0.005, b=0.26±0.005, and c=0.50±0.01;
(c) a memory element;
(d) a word line, and wherein the $Cu_aCr_bS_c$ layer and the memory element are:
(i) sandwiched between the bit line and the word line, and (ii) in electrical series with the word and bit lines.

18. The device of claim 17, wherein the device operates reliably at a current density greater than $5\times10^6$ A/cm$^2$.

19. The device of claim 17, wherein the device has a voltage margin greater than 1V.

20. A crosspoint memory array comprising an array of the devices of claim 17.

21. A method, comprising applying voltage to the array of claim 20, thereby changing the state of one of the memory elements.

22. The method of claim 21, further comprising reading out the state of said one of the memory elements.

23. The method of claim 22, wherein the state that is read out is the resistance of one of the memory elements.

24. The device of claim 17, wherein the device is part of any of, or a combination of, the following structures: a mushroom structure, a recessed mushroom structure, a pillar cell, a lithographic pore structure, a sublithographic pore structure, and a ring-shaped cell structure.

25. The device of claim 17, wherein said memory element is any of the following: phase change memory (PCM), resistive RAM (RRAM), or magnetoresistive RAM (MRAM).

26. A device, comprising:
(a) a bit line;
(b) a $Cu_aCr_bSe_c$ layer sandwiched by top and bottom conductive layers, wherein
a=0.24±0.005, b=0.26±0.005, and c=0.50±0.01;
(c) a memory element;
(d) a word line, and
wherein the $Cu_aCr_bSe_c$ layer and the memory element are:
(i) sandwiched between the bit line and the word line, and (ii) in electrical series with the word and bit lines.

27. The device of claim 26, wherein the device operates reliably at a current density greater than $5\times10^6$ A/cm$^2$.

28. The device of claim 26, wherein the device has a voltage margin greater than 1V.

29. A crosspoint memory array comprising an array of the devices of claim 26.

30. The device of claim 26, wherein said memory element is any of the following: phase change memory (PCM), resistive RAM (RRAM), or magnetoresistive RAM (MRAM).

* * * * *